(12) United States Patent
Takano et al.

(10) Patent No.: US 7,356,092 B2
(45) Date of Patent: Apr. 8, 2008

(54) WIRELESS COMMUNICATION SYSTEM AND COMMUNICATION SEMICONDUCTOR INTEGRATED CIRCUIT DEVICE

(75) Inventors: Ryoichi Takano, Takasaki (JP); Kazuhiko Hikasa, Hamura (JP); Kenji Toyota, Takasaki (JP); Kazuhisa Okada, Kiryu (JP)

(73) Assignee: Renesas Technology Corporation, Tokyo (JP)

( * ) Notice: Subject to any disclaimer, the term of this patent is extended or adjusted under 35 U.S.C. 154(b) by 727 days.

(21) Appl. No.: 10/808,318

(22) Filed: Mar. 25, 2004

(65) Prior Publication Data
US 2004/0219893 A1 Nov. 4, 2004

(30) Foreign Application Priority Data
Mar. 27, 2003 (JP) .............................. 2003-087238

(51) Int. Cl.
*H04L 27/36* (2006.01)
(52) U.S. Cl. ...................... 375/298; 375/300; 375/302
(58) Field of Classification Search ................ 375/257, 375/308, 298, 300; 455/114.3
See application file for complete search history.

(56) References Cited

U.S. PATENT DOCUMENTS 5,086,512 A * 2/1992 Bartz ...................... 455/168.1
6,295,422 B1 * 9/2001 Curry et al. .................. 399/12
6,433,639 B1 * 8/2002 Numanami et al. ......... 330/277
6,750,719 B2 * 6/2004 Toyota et al. ............... 330/285

FOREIGN PATENT DOCUMENTS

JP        2003/048525        2/2003

OTHER PUBLICATIONS

"High Linearity RF Amplifier Design", by P. Kenington, 1979, Artech House, Inc., pp. 162.

* cited by examiner

*Primary Examiner*—David B. Lugo
(74) *Attorney, Agent, or Firm*—Mattingly, Stanger, Malur & Brundidge, P.C.

(57) ABSTRACT

When a transmitting oscillator is built in a communication semiconductor integrated circuit device like a high-frequency IC constituting a wireless communication system, the system prevents degradation of the accuracy of control on the output power of a power amplifier due to noise jumped from an output pin of the transmitting oscillator to an input pin for a detected signal (feedback signal) of an output level of the power amplifier. The transmitting oscillator is built in the high-frequency IC. The detected signal of the output level of the power amplifier, which is detected by a coupler, is attenuated to a level slightly higher than the level of noise jumped from the output pin of the transmitting oscillator to the input pin for a feedback signal of an amplitude control loop, which in turn is inputted to the feedback signal input pin of the high-frequency IC.

11 Claims, 5 Drawing Sheets

FIG. 5

WIRELESS COMMUNICATION SYSTEM AND COMMUNICATION SEMICONDUCTOR INTEGRATED CIRCUIT DEVICE

CROSS-REFERENCE TO RELATED APPLICATION

The present application claims priority from Japanese patent application JP 2003-087238 filed on Mar. 27, 2003, the content of which is hereby incorporated by reference into this application.

BACKGROUND OF THE INVENTION

The present invention relates to a technique effective for application to a wireless communication system having a phase control loop for phase modulation and an amplitude control loop for amplitude modulation, and particularly to a technique effective for application to a communication semiconductor integrated circuit device which incorporates a phase detection circuit and an amplitude detection circuit therein, and a wireless communication system such as a cellular phone with the communication semiconductor integrated circuit device built therein.

A system called "GSM (Global System for Mobile Communication)"; adopted in Europe has heretofore been known as one system of a wireless communication device (mobile communication device) such as a cellular phone. A phase modulation system called "GMSK (Gaussian Minimum Shift Keying)" wherein the phase of a carrier is shifted according to transmit data, has been used in the GSM system.

On the other hand, there has been proposed an EDGE (Enhanced Data Rates for GSM Evolution) system for a recent cellular phone. The EDGE system includes a dual mode communication function which carries out audible signal communications with GMSK modulation and performs data communications with 3π/8rotating8-PSK (Phase Shift Keying) modulation. The 8-PSK modulation is equivalent to such modulation that an amplitude shift is further added to a phase shift in carrier under the GMSK modulation. The GMSK modulation is one in which information of one bit per symbol is transmitted, whereas information of 3 bits per symbol can be transmitted in the 8-PSK modulation. Therefore, the EDGE system is capable of carrying out communications at a high transmission rate as compared with the GSM system.

As a method of realizing a modulation system for causing a phase component and an amplitude component of a transmit signal to have information, there has heretofore been known a method called "polar loop" wherein a signal to be transmitted is separated into a phase component and an amplitude component, which in turn are subjected to feedback under a phase control loop and an amplitude control loop respectively, after which they are combined by an amplifier, followed by execution of the output thereof (see, for example, "High Linearity RF Amplifier Design" by Kenington, Peter B. published by ARTECH HOUSE, INC., in 1979, pp 162).

Meanwhile, efforts are being made to take or bring as many circuits as possible in one or plural semiconductor integrated circuits in order to reduce the number of parts to thereby bring the system into less size and cost in a wireless communication system in recent years. As one of them, there is known a technique for incorporating a transmitting oscillator into a communication semiconductor integrated circuit device (hereinafter called "high-frequency IC") having a modem function. As to a high-frequency IC constituting a GSM type communication system, one in which a transmitting oscillator is on-chipped, has been developed and proposed by the present applicant (see Patent Document 1).

Patent Document 1

Japanese Unexamined Patent Publication No. 2003-048525 corresponds to U.S. Ser. No. 10/253,922 filed on Sep. 9, 2002.

SUMMARY OF THE INVENTION

The present inventors have conducted an investigation about the technique of incorporating a transmitting oscillator into a high-frequency IC constituting an EDGE type communication system. As a result, it was apparent that it had the following problems. Incidentally, the polar loop system discussed by the present inventors is a system wherein as to a phase control loop, the output of a transmitting oscillator or the output of a high-frequency power amplifier (hereinafter called "power amplifier") is detected and fed back to a phase comparator for comparing the output with a reference signal, whereas as to an amplitude control loop, the output of the power amplifier is detected and fed back to an amplitude comparator for comparing the output with a reference signal. Such a polar loop system has been disclosed in the patent application (Japanese Unexamined Patent Publication No. 2003-54042) proposed by the present applicant or the like.

In systems such as GSM and DCS (Digital Cellular System) each of which has adopted the GMSK modulation system, a carrier may be phase-modulated according to transmit data and outputted. Therefore, only the phase control loop will be enough to serve as a feedback control loop. The wireless communication system disclosed in the patent document 1 is one in which a quadrature modulator of a transmitting circuit performs phase modulation alone and up-converting is done by a system called "offset PLL system". When the transmitting oscillator is built in the high-frequency IC, the feedback control loop for phase control can also be configured so as to be closed within a chip. Therefore, such defects to be described below do not occur.

On the other hand, in the EDGE system having adopted the polar loop system, a phase component and an amplitude component are respectively extracted from a signal modulated by a modulator and controlled separately, after which they are combined in vector, followed by execution of the output of its result. Therefore, two feedback control loops of a phase control loop and an amplitude control loop are required. At least the amplitude control loop needs to be configured in such a manner that an output level of a power amplifier at a stage posterior to a transmitting oscillator is detected and fed back to thereby control the gain of the power amplifier.

Thus, when a transmitting oscillator is built in a high-frequency IC in a system wherein a power amplifier and a high-frequency IC are respectively configured of discrete semiconductor chips, an oscillation signal of the transmitting oscillator is outputted from an external terminal of the high-frequency IC to the power amplifier lying outside a chip. A detected signal of a coupler for detecting a transmit signal outputted from the power amplifier is inputted to its corresponding external terminal of the high-frequency IC and supplied to an amplitude comparator or both the amplitude comparator and a phase comparator provided inside an IC chip via a feedback path.

Here, the transmit signal generated by the transmitting oscillator provided within the high-frequency IC and outputted outside, and the feedback signal detected by the coupler and inputted to the high-frequency IC are identical to each other in frequency. That is, noise from the transmitting oscillator side cannot be cut by a filter on the feedback path. Since the output level of the power amplifier is so high and the level of the detected signal of the coupler becomes also large, the polar loop type communication system of the invention of the prior application proposed by the present inventors has attenuated the signal detected by the coupler by 26 dB or more and inputted it to the high-frequency IC.

However, when the transmitting oscillator is built in the high-frequency IC, the level at an output pin of the transmitting oscillator is about 7.8 dBm. Therefore, the level of noise jumped from the output pin of the transmitting oscillator to a feedback signal input pin of the amplitude control loop becomes near −40 dBm where no particular isolation is done. Thus, when the power amplifier is operating at an output level like −14 dBm corresponding to the minimum output level, for example, the input level of the feedback signal of the amplitude control loop results in the same degree as the level (−40 dBm) of the noise jumped into the pin or a level lower than the noise level. As a result, it became apparent that a problem arose in that accurate output control of the power amplifier could not be carried out. Incidentally, the high-frequency IC is assumed to be not placed in a bear chip state but in a state of being put or encapsulated in a package here.

Thus, the present inventors have carried out discussions even about the fact that in order to enhance isolation between the output pin of the transmitting oscillator and the input pin for the feedback signal of the amplitude control loop, both pins are located at positions farthest away from each other. However, the results are almost the same. The level of the noise jumped into the feedback signal input pin could not lowered sufficiently. Further, a defective condition also arise in that if one attempts to purposely provide the output pin of the transmitting oscillator and the input pin for the feedback signal of the amplitude control loop at the positions away from each other, this is passed along to the layout of other circuits so that layout design on the whole chip becomes cumbersome, and a needless space region occurs, thereby increasing a chip's area.

An object of the present invention is to provide a communication semiconductor integrated circuit device suitable for use in a wireless communication system having a feedback control loop for controlling the phase and amplitude of a transmit signal, wherein the number of parts constituting the system is reduced and packaging density is enhanced to thereby make it possible to achieve its size reduction and reduce the cost thereof.

Another object of the present invention is to prevent degradation of the accuracy of control on output power of a power amplifier due to noise jumped into an input pin for an output level detected signal of the power amplifier from an output pin of a transmitting oscillator where the transmitting oscillator is built in a communication semiconductor integrated circuit device like a high-frequency IC constituting a wireless communication system having a feedback control loop for controlling output power of the power amplifier.

The above of the present invention, and other objects and novel features thereof will become apparent from the description of the Specification and the accompanying drawings.

A summary of a representative one of the inventions disclosed in the present application will be described in brief as follows:

A transmitting oscillator is built in a high-frequency IC constituting a wireless communication device which has a phase control loop for controlling the phase of a carrier outputted from the transmitting oscillator and an amplitude control loop for controlling the amplitude of a transmit output signal outputted from a power amplifier and enables transmission based on GMSK modulation mode and transmission based on an 8-PSK modulation mode. A detected signal of an output level of a power amplifier, which is detected by a coupler, is attenuated to a level slightly higher than the level of noise jumped from an output pin of the transmitting oscillator to an input pin for a feedback signal of the amplitude control loop, which in turn is inputted to the feedback signal input pin of the high-frequency IC.

Thus, it is possible to reduce the number of parts constituting the system and enhance packaging density. Incidentally, here, the building of the transmitting oscillator in the high-frequency IC is assumed to include, as well as a case in which all elements constituting the transmitting oscillator are built therein, a case in which when the transmitting oscillator is a circuit equipped with inductance elements, like, for example, an LC resonant oscillator, external elements are used for inductance elements hard to obtain desired characteristics in an on-chip device, and other constituent elements excluding the inductance elements are formed on the same chip as a semiconductor chip formed with a modulator.

DETAILED DESCRIPTION OF THE INVENTION

Figure 1:
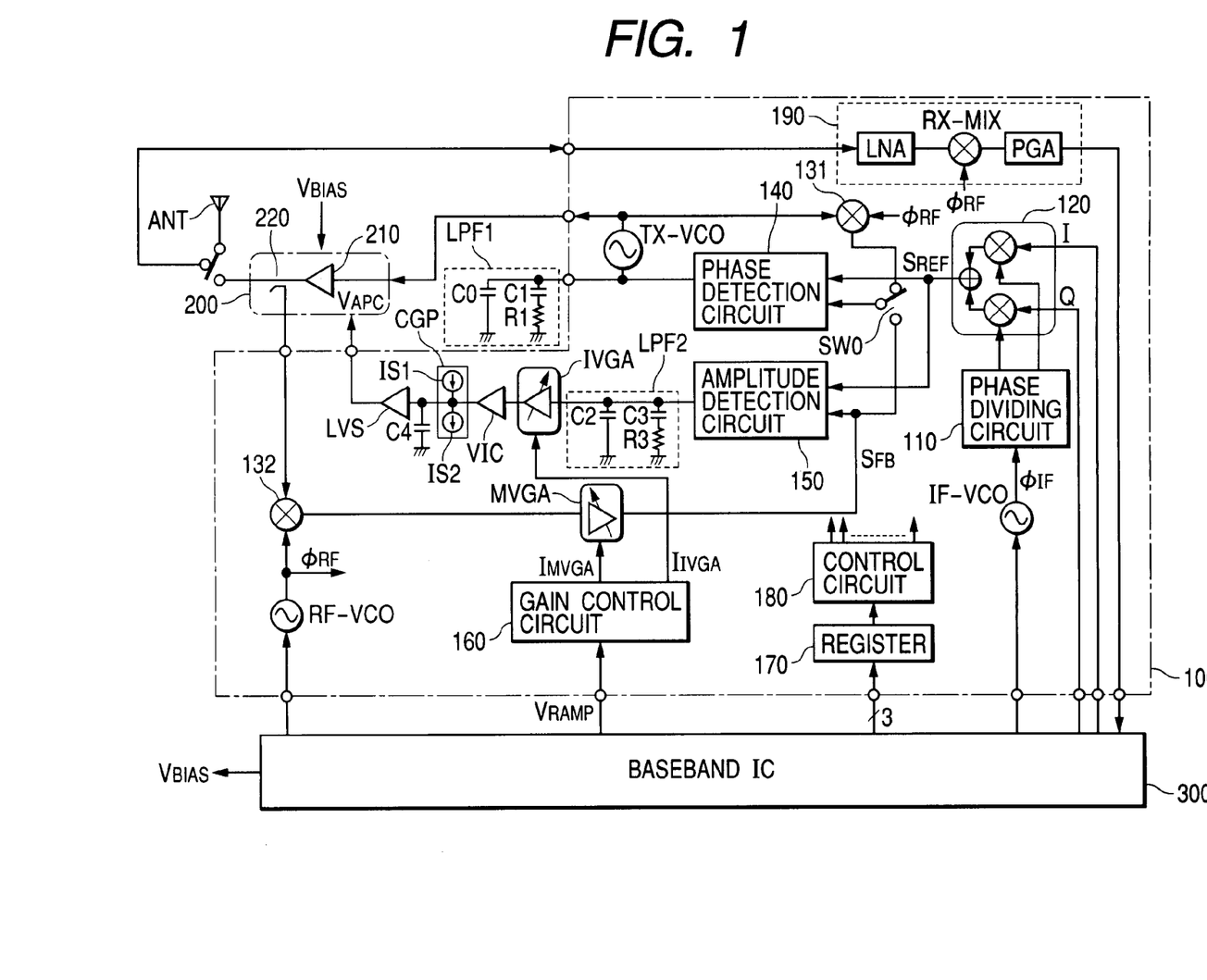
FIG. 1 is a block diagram showing a schematic configuration of one embodiment of a polar loop type wireless communication system suitable for application of the present invention.

FIG. 1 shows a schematic configuration of one embodiment of a polar loop type wireless communication system suitable for application of the present invention. The wireless communication system shown in FIG. 1 comprises a high-frequency IC 100 used as a communication semiconductor integrated circuit device capable of performing GMSK modulation in a GSM system and 8-PSK modulation in an EDGE system, a power module 200 including a power amplifier (high-frequency power amplifier circuit) 210 for driving an antenna ANT to perform transmission and a coupler 220 for detecting transmitting power, and a baseband circuit 300 which generates an I/Q signal, based on transmit data (baseband signal) and generates control signals for the high-frequency IC 100 and a bias voltage VBIAS with respect to the power amplifier 210 lying in the power module 200. The baseband circuit 300 can be configured on one semiconductor chip as a semiconductor integrated circuit. Since the baseband circuit is explained using an example formed of the semiconductor integrated circuit, the baseband circuit will be described as the baseband IC 300.

In the present embodiment, a reception system circuit 190 comprising a low-noise amplifier (LNA) which amplifies a receive signal, a mixer (Rx-MIX) which mixes the receive signal and an oscillation signal outputted from an RF-VCO and directly down-converts the receive signal to a baseband signal, a high-gain programmable gain amplifier (PGA), etc. is formed on a chip of the high-frequency IC 100 in addition to a transmission system circuit comprising a modulator 120, a transmitting oscillator TxVCO which generates a phase-modulated transmit signal (carrier), etc.

The wireless communication system according to the present embodiment includes two control loops of a feedback control loop (called "phase control loop" or "sub phase control loop" in the present Specification) for phase control, and a feedback control loop (called "amplitude control loop" in the present Specification) for amplitude control.

The high-frequency IC 100 includes a phase dividing circuit 110 which divides, for example, an oscillation signal φIF having a frequency of 640 MHz generated by an oscillator IF-VCO and generates signals each having an intermediate frequency of 80 MHz, which are shifted 90° in phase, a quadrature modulator 120 which mixes the I/Q signal supplied from the baseband IC 300 and the signal divided by the phase dividing circuit 110 to perform quadrature modulation, a mixer 131 which mixes the feedback signal outputted from the transmitting oscillator TxVCO and the oscillation signal φRF sent from the high-frequency oscillator RF-VCO and down-converts the mixed signal to a signal of 80 MHz, a phase detection circuit 140 which detects the difference in phase between the output signal of the mixer 131 and a signal outputted from the quadrature modulator 120, a mixer 132 which mixes a detection signal of the coupler 220 which detects an output level of the power amplifier 210, and the oscillation signal φRF sent from the high-frequency oscillator RF-VCO, a feedback side variable gain amplifier MVGA which amplifies the output of the mixer 132, an amplitude detection circuit 150 which compares the signal amplified by the amplifier MVGA and the output signal of the quadrature modulator 120 and thereby detect the difference in amplitude therebetween, a loop filter LPF2 which generates a voltage proportional to the output of the amplitude detection circuit 150 and regulates a frequency bandwidth of the amplitude control loop, a forward pass side variable gain amplifier IVGA which amplifies a signal passed through the loop filter LPF2, a current-voltage converter VIC, a gain control circuit 160 which controls the gain of each of the variable gain amplifiers MVGA and IVGA, a register 170 for setting control information, an operation mode, etc. inside a chip, a control circuit 180 which controls respective circuits lying inside the chip on the basis of the set values of the register 170, etc.

The control circuit 180 is configured so as to have the function of a sequencer that generates timing signals for activating internal circuits in a predetermined order according to an input command and a designated operation mode from the external baseband IC 300.

The amplitude control loop comprises a loop extending from the coupler 220 to the power amplifier 210 via the mixer 132, variable gain amplifier MVGA, amplitude detection circuit 150, loop filter LPF2 and variable gain amplifier IVGA. The phase control loop comprises a loop extending from the phase detection circuit 140 to the phase detection circuit 140 via the loop filter LPF1, transmitting oscillator TxVCO and mixer 131. In the present embodiment, the loop filter LPF1, which limits the band of the phase control loop, comprises external capacitors C0 and C1 and an external resistor R1 arranged in series with the capacitor C1.

When a difference in phase occurs between the output signal of the quadrature modulator 120 and the feedback signal outputted from the mixer 131 in the high-frequency IC 100 employed in the present embodiment, such a voltage as to reduce this phase difference is supplied to its corresponding frequency control terminal of the transmitting oscillator TxVCO, so that the phase of the feedback signal outputted from the mixer 131 is controlled so as to coincide with that of the output signal of the quadrature modulator 120. Owing to the phase control loop, the phase of the output of the transmitting oscillator TxVCO is controlled so as not to be shifted with respect to a variation in power supply voltage and a change in temperature. Incidentally, the amplitude of the transmitting oscillator TxVCO is constant.

Further, in the high-frequency IC 100 employed in the present embodiment, the output of the variable gain amplifier MVGA is supplied to both the phase detection circuit 140 and the amplitude detection circuit 150. A selector switch SW0 is provided to allow a path from the coupler 220 to the variable gain amplifier MVGA through the mixer 132 to be used as a feedback path shared between the amplitude control loop and the phase control loop. The selector switch SW0 is changed over by the control circuit 180 according to the state of setting of the register 170 whose setting is performed by the baseband IC 300.

Since both a phase-modulated component and an amplitude-modulated component are contained in the output of the power amplifier 210 in an EDGE mode, the output of any of the transmitting oscillator TxVCO and the output of the power amplifier 210 may be used as a signal to be fed back to the phase detection circuit 140, which has a phase component on the output side. Since, however, the output of the power amplifier 210 is not yet raised at the start of transmission, the feedback signal sent from the amplitude control loop cannot lock the phase control loop.

In the EDGE mode, the feedback path of the amplitude control loop is indispensable to the correction of distortion developed in the power amplifier. Therefore, it may be practiced to share the feedback path between the amplitude control loop and the phase control loop after the loop has been locked and to block or cut off the sub phase control loop on the TxVCO side including the mixer 131. Consequently, power consumption can be reduced and higher-accuracy phase modulation can be done.

Thus, in the present embodiment, the switch SW0 is changed over to the side of selecting the feedback signal sent from the sub phase control loop, i.e., the mixer 131 upon an output rise. When the loop is made stable, the switch SW0 is changed over to the side of selecting a signal sent from the feedback path, i.e., the variable gain amplifier MVGA (this loop is called "main phase control loop" in the present Specification and distinguished from the sub phase control loop). Thus, after stabilization of the loop, the phase of the output of the power amplifier 210 is controlled so as to coincide with the phase of a signal SREF outputted from the modulator 120, whereby phase control higher in accuracy than the control based on the sub phase control loop is enabled.

The loop filter LPF1 on the sub phase control loop comprises the capacitors C0 and C1 and the resistor R1 connected in series with the capacitor C1. The values of the capacitors and the resistor are determined in such a manner that the frequency band of the loop filter LPF1 reaches a frequency band like 1.2 MHz high in the degree of noise suppression, in consideration of the GMSK modulation mode that performs only phase modulation.

Further, in the present embodiment, the sub phase control loop is configured so as to be capable of being shared between the GMSK modulation mode and the 8-PSK modulation mode. Described specifically, although not shown in the drawing, a resistor and a switch provided in series with it are provided in parallel with the resistor R1 of the loop filter LPF1. When the switch is turned on, the frequency band of the loop filter LPF1 is configured so as to spread to 1.8 MHz. That is, the frequency band of the loop filter LPF1 is set to 1.8 MHz identical to the amplitude control loop in the 8-PSK modulation mode. Thus, the operation is stabilized. When the switch is turned off in the GMSK modulation mode, the frequency band of the loop filter LPF1 is set to 1.2 MHz narrower than the amplitude control loop. Thus, the stability of the loop and the degree of noise suppression can be enhanced.

In the transmission system circuit of the high-frequency IC 100 employed in the present embodiment, when it is operated in the 8-PSK modulation mode, the output power of the power amplifier 210 is detected by the coupler in the amplitude control loop after stabilization of the loop, and its detected signal is then mixed with the oscillation signal φRF outputted from the high-frequency oscillator RF-VCO in the mixer 132, followed by conversion to a signal having an intermediate frequency (IF). Then, the signal is amplified by the variable gain amplifier MVGA, which in turn is supplied to the amplitude detection circuit 150 as a feedback signal SFB.

Then, the amplitude detection circuit 150 compares the feedback signal SFB and the signal SREF modulated by the quadrature modulator 120 to thereby detect the difference in amplitude therebetween. The amplitude difference is supplied to the variable gain amplifier IVGA via the loop filter LPF2 and amplified, after which it is applied to its corresponding output control terminal of the power amplifier 210 as a control voltage VAPC, whereby amplitude control is carried out.

Further, in the present embodiment, a charge pump CGP and a level shifter LVS are provided at a subsequent stage of the variable gain amplifier IVGA. The charge pump CGP performs charge up or discharge in accordance with the differential output of the variable gain amplifier IVGA and thereby integrates an output current of the variable gain amplifier IVGA. The level shifter LVS shifts the voltage generated by the charge pump by about 0.6V in a negative direction. The charge pump CGP comprises a pair of current sources IS1 and IS2 and a capacitor C4. The level shifter LVS is provided because the application of up to 0V to the output power module 200 as a control voltage is required, whereas the charge pump CGP employed in the present embodiment cannot output 0V from the property of the current source IS2.

In the present embodiment, the power amplifier 210 comprises an FET or the like. A voltage control circuit (not shown) provided in the power module 200 generates a drive voltage (Vdd) corresponding to the control voltage VAPC, after which it is applied to a drain terminal or a source terminal of the FET. A suitable bias voltage VBIAS generated by the baseband IC 300 or an unillustrated bias circuit is applied to a gate terminal of the power FET.

A description will now be made of gain control on the variable gain amplifier IVGA on the forward path and the variable gain amplifier MVGA on the feedback path.

In an EDGE- or GSM-adaptable cellular phone terminal, power control for increasing or decreasing output power POUT of the power amplifier to a desired value within a predetermined time interval is carried out. In the system of the present embodiment, which has adopted the polar loop system, the power control is performed by controlling the gain of the variable gain amplifier MVGA. Described specifically, if the gain of the variable gain amplifier MVGA is reduced, then the feedback signal SFB to the amplitude detection circuit 150 decreases. Thus, the amplitude control loop acts so as to increase RF gain GPA (POUT/PIN) of the power amplifier and cause the feedback signal SFB and the reference signal SREF outputted from the modulator to coincide with each other.

Thus, when the gain of the variable gain amplifier MVGA is reduced, the output power POUT increases. When it is desired to reduce the output power POUT, the gain of the variable gain amplifier MVGA may be increased. In the present embodiment, the gain of the variable gain amplifier MVGA is controlled by a control voltage VRAMP outputted from the baseband IC 300. In addition, the rate of a decrease or increase in the GMVGA of the variable gain amplifier MVGA and the rate of an increase or decrease in the gain GIVGA of the variable gain amplifier IVGA are always equalized to stable the amplitude control loop.

On the other hand, the reference signal SREF supplied from the quadrature modulator 120 to the phase detection circuit 140 and the amplitude detection circuit 150 is a signal modulated by 8-PSK and changes in amplitude component and phase component. However, such control that a change in the amplitude component of the output power POUT of the power amplifier coincides with a change in the amplitude component of the reference signal SREF is preformed under the action of the amplitude control loop. Under the action of the phase control loop, such control that a change in the phase component of the output power POUT of the power amplifier coincides with a change in the phase component of the reference signal SREF is performed. As a result, the output of the power amplifier results in an output subjected to modulation extremely close to the original modulation of the 8-PSK modulated signal generated by the quadrature modulator 120. Incidentally, the output power POUT of the power amplifier 210 is set to a desired value by the power control referred to above.

In the feedback path of the sub phase control loop, although not shown in FIG. 1, an attenuator for attenuating the output of the oscillator TxVCO and supplying it to the mixer 131 is provided between the transmitting oscillator TxVCO and the mixer 131. Further, a low-pass filter for removing a higher harmonic wave is provided between the mixer 131 and the phase detection circuit 140. On the other hand, in the feedback path of the amplitude control loop, an attenuator is provided between the coupler 220 and the mixer 132, and low-pass filters for removing an unnecessary wave and a higher harmonic wave are respectively provided between the mixer 132 and the variable gain amplifier MVGA and between the variable gain amplifier MVGA and the amplitude detection circuit 150.

A configuration of the first embodiment according to the present invention and its operation will next be explained.

Figure 2:
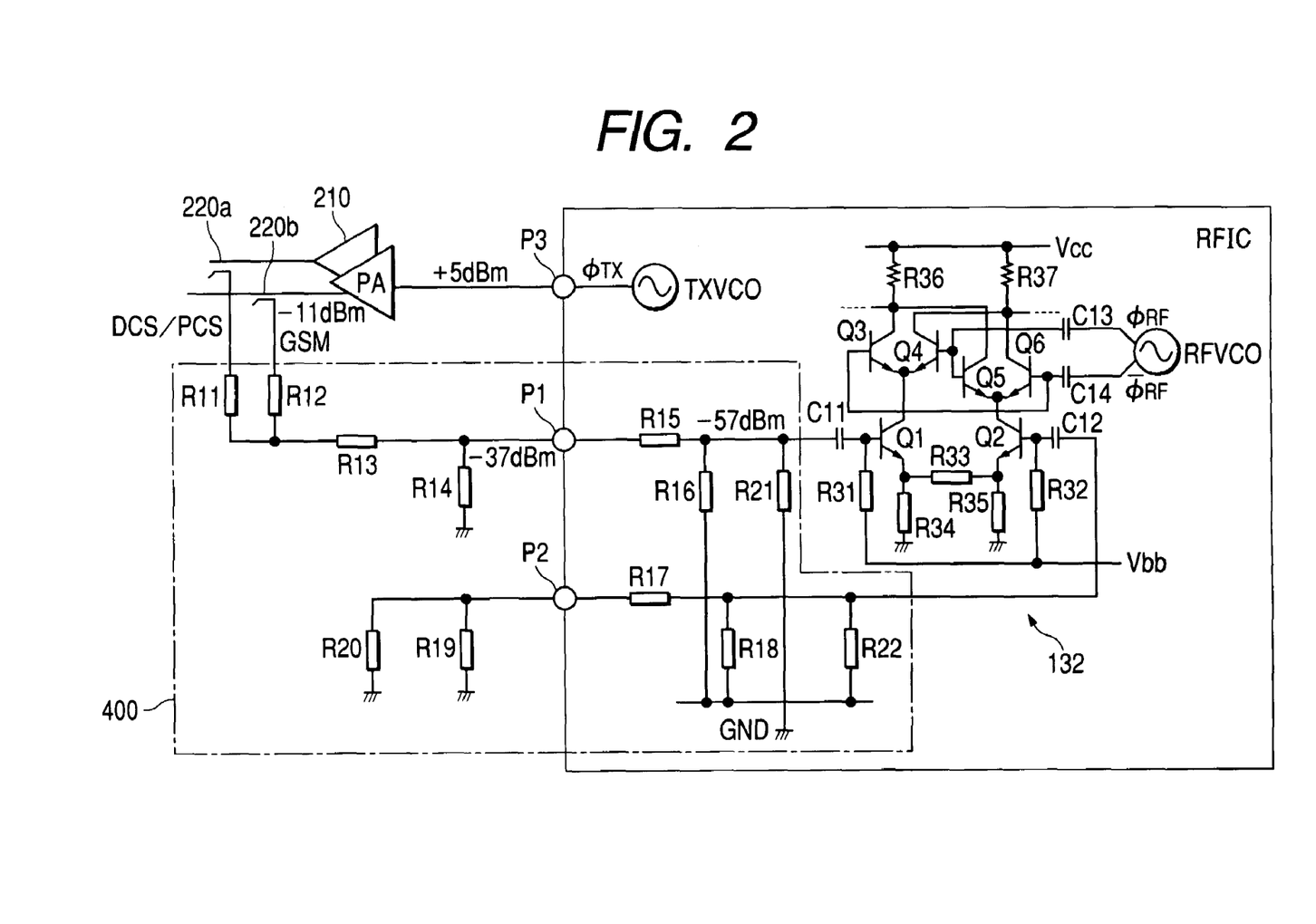
FIG. 2 is a circuit diagram showing a first embodiment illustrative of both an attenuator provided between a coupler for detecting an output level of a power amplifier and a down-converting mixer and the down-converting mixer in the polar loop type wireless communication system.

A configurational example illustrative of an attenuator 400 provided between the couplers 220a and 220b each of which detects an output level of the power amplifier 210 and the mixer 132, and the mixer 132 both employed in the polar loop type wireless communication system shown in FIG. 1 is shown in FIG. 2.

Incidentally, the two couplers 220a and 220b are shown in FIG. 2 because the high-frequency IC 100 according to the present embodiment is adaptable to three communication systems of GSM of 800 MHz, DCS of 1800 MHz and PCS (Personal Communication System) of 1900 MHz, and two power amplifiers 210 are also provided according to it. Although not shown in the drawing, two TxVCOs are also provided. Since DCS of 1800 MHz and PCS of 1900 MHz are close to each other in frequency band, the common TxVCO, power amplifier and coupler are used in the generation, amplification and detection of a transmit signal.

In the first embodiment, as shown in FIG. 2, the attenuator 400 comprises a π-type attenuator which comprises resistors R11 through R22. Along with it, the high-frequency IC 100 is provided with a dummy input pin P2 in addition to an input pin P1 provided to supply a signal detected by the coupler 220 to the mixer 132.

In the first embodiment, the resistors R11 through R14 of the resistors R11 through R22 constituting the π-type attenuator are connected between the couplers 220a and 220b for respectively detecting the output levels of the power amplifiers 210 and the input pin P1 for inputting the detected signals of the couplers. Also the resistors R15 through R18, R21 and R22 of the resistors R11 through R22 constituting the π-type attenuator are connected between the input and dummy pin P1 and P2 and the mixer 132. The resistors R21 and R22 of these resistors are terminating resistances like 50Ω.

Thus, the amount of attenuation of each detected signal inputted to the high-frequency IC 100 can be reduced as compared with the case in which all the resistors R11 through R22 constituting the attenuator are connected to the outside of the chip. That is, a signal level at the input pin P1 to which the detected signal of the coupler 220 is inputted, becomes greater than a signal level where all the resistors constituting the attenuator are provided outside the chip.

In the present embodiment, the values of the resistors R11 through R13 are set in such a manner that the level of the detected signal at the input pin P1 at the time that the power amplifier 210 at transmission is of a minimum level, becomes greater than the level of noise jumped into the input pin P1 for the detected signal of the corresponding coupler from the output pin P3 of the TxVCO.

When, for example, the output level at the output pin P3 of the TxVCO is +5 dBm, the level of the noise carried or jumped into the input pin P1 is −40 dBm, and the level of the detected signal of the coupler 220 is −11 dBm corresponding to the convergent level of the amplitude control loop, the detected signal (−11 dBm) of the coupler 220 is attenuated by about 26 dBm by the resistors R11 through R14, and the values of the resistors R11 through R13 may be determined in such a manner that the level of the detected signal at the input pin P1 becomes −37 dBm. Thus, it is possible to prevent degradation of the accuracy of feedback control based on the amplitude control loop due to a deterioration of S/N ratio of the signal inputted to the mixer 132.

However, the level of the noise jumped into the input pin P1 depends on the distance between the input pin P1 and the output pin P3, the absence or presence of a countermeasure against isolation, etc. Further, the level of the detected signal at the coupler 220 depends on the sensitivity of the coupler. Therefore, the specific values of the resistors R11 through R13 may suitably be determined according to the distance between the pins P1 and P3, the sensitivity of the coupler, etc.

The values of the resistors R14, R16, R18 and R19 whose one terminals are connected to their corresponding ground points, are respectively set to a value (e.g., 61Ω) slightly greater than 50Ω of each of the terminating resistances R21 and R22 in the present embodiment. Further, the resistance values of the resistors R15 and R17 connected in series between the input pins P1 and P2 and the input terminal of the mixer 132 are respectively set to a value (e.g., 248Ω) equivalent to about several times the resistance value of each of the resistors R14, R16, R18 and R19. Thus, the detected signal inputted to the pin P1 is further attenuated about 20 dBm by the resistors R15 and R16, followed by being supplied to the mixer 132.

The resistors R11 through R14 of the resistors R11 through R22 constituting the attenuator are connected to the input pin P1 as the external resistors, whereas the resistors R19 and R20 whose one terminals are parallel-connected to their corresponding ground points, are connected to the dummy input pin P2. The resistor R20 of the resistors R19 and R20 is a terminating resistance like 50Ω. As an alternative to the resistor R16, a conjugate impedance matching circuit comprising a variable resistor and a capacitive element provided in parallel configuration may be provided to allow the substantial impedance of the dummy input pin P2 to assume 50Ω.

Further, in the first embodiment of FIG. 2, a differential circuit called "Gilbert cell" is used as the mixer 132 although not limited in particular. In the case of the mixer comprising such a Gilbert cell, the detected signal of the coupler 220 is inputted to a base terminal of one of differential input transistors Q1 and Q2, and an intermediate potential of the detected signal of the coupler 220 is inputted to a base terminal of the other transistor. Consequently, the mixer can be operated as a single-input type circuit and hence the number of pins can be reduced.

Such a single-input type mixer has been supposed in the invention (Japanese Unexamined Patent Publication No. 2003-54042 corresponding to U.S. Ser. No. 10/373,031 filed on Feb. 26, 2003) of the prior application proposed by the present inventors. However, in order to prevent degradation of the accuracy of the feedback control due to the noise jumped from the output pin P3 of the TxVCO as described above, the dummy input pin P2 is provided in addition to the original input pin P1 for the detected signal in the present embodiment, and the base terminal of one (Q2 in FIG. 2) of the differential input transistors constituting the mixer 132 is connected to the dummy input pin P2 via a capacitor C12. Thus, the same noise as the noise jumped into the detected signal input pin P1 from the output pin P3 of the TxVCO is inputted to the differential input transistors from the dummy input pin P2 to thereby reduce the amount of noise by means of an inphase noise canceling effect included in the differential circuit.

In the mixer 132 shown in FIG. 2, a bias voltage Vbb is applied to the bases of the differential input transistors Q1 and Q2 via resistors R31 and R32 respectively. The detected signal corresponding to the power amplifier output inputted to the input pin P1 is changed with the bias voltage Vbb as the operating point (center potential).

Further, common-emitter connected transistor pairs Q3 and Q4, and Q5 and Q6 are connected to the collectors of the differential input transistors Q1 and Q2. The collectors of the transistors Q3 and Q5 are connected to a common load resistor R36, whereas the collectors of the transistors Q4 and Q6 are connected to a common load resistor R37. Oscillation signals φRF and /φRF outputted from a high-frequency oscillator RFVCO are inputted to the bases of the transistors Q3 through Q6 via capacitors C13 and C14. Then, the detected signal corresponding to the power amplifier output inputted from the input pin P1 and the oscillation signal φRF are combined together so that a signal containing a frequency component corresponding to the difference in frequency therebetween is outputted.

Figure 3:
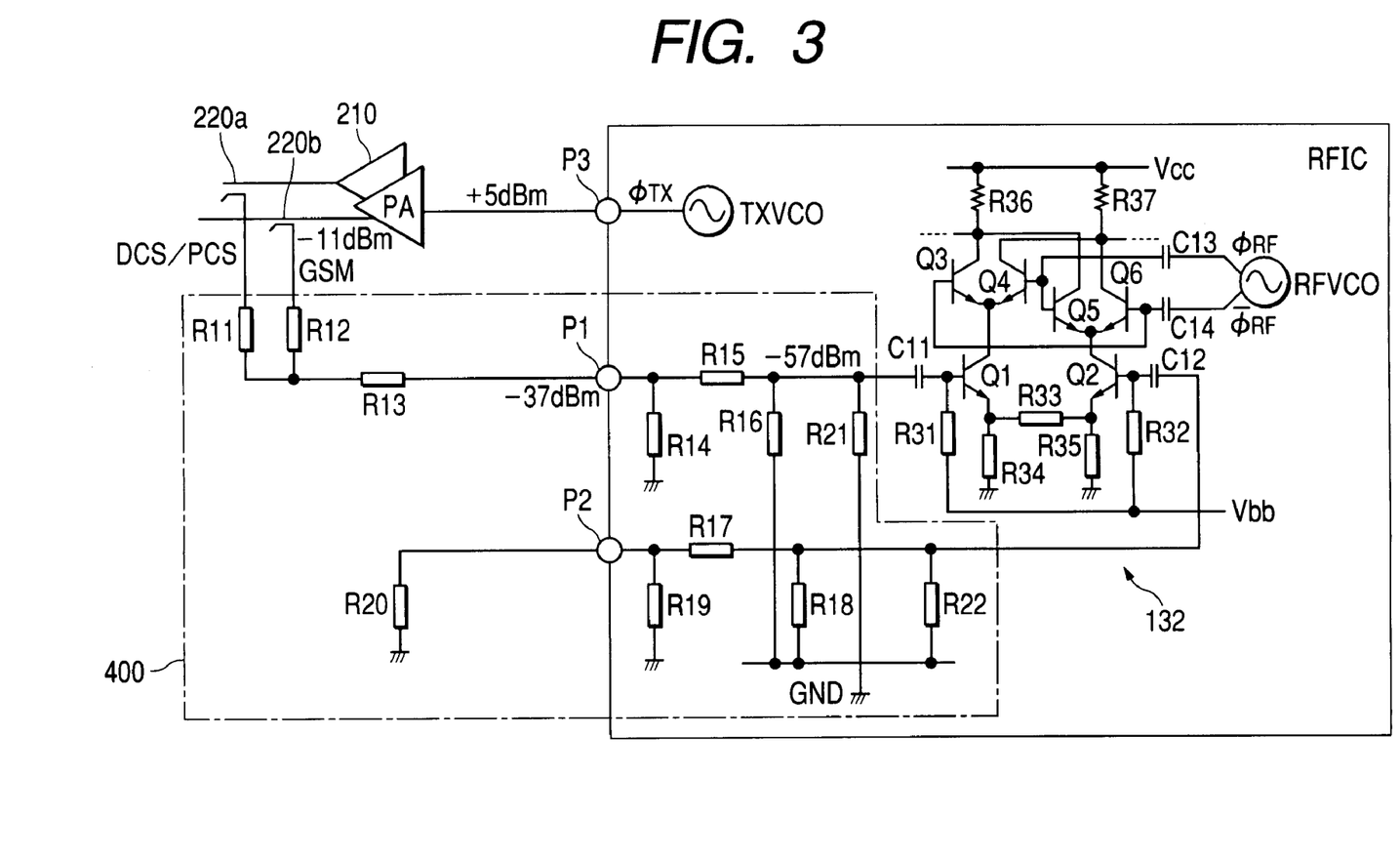
FIG. 3 is a circuit diagram illustrating a modification of the attenuator used in a transmitting device employed in the embodiment shown in FIG. 2.

A modification of the attenuator of the first embodiment is shown in FIG. 3. The modification is equivalent to one wherein of the resistors R11 through R19 constituting the attenuator in the first embodiment of FIG. 2, the resistors R14 and R19 connected to the pins P1 and P2 as external elements are formed on the chip of the high-frequency IC 100 together with the R15 through R17.

In a manner similar to the circuit shown in FIG. 2, the present modification also obtains the effect of setting the level of a detected signal from the coupler, which is inputted to the input pin P1, greater than the level of noise jumped into the detected signal input pin P1 from the output pin P3 of the TxVCO and thereby allowing an S/N ratio of the signal inputted to the mixer 132 to increase. Further, the modification has the advantage that since the resistors R14 and R19 are on-chipped, the number of parts can further be reduced. However, the present modification is accompanied by a drawback that when the ground potential inside the chip is not sufficiently stable, the present attenuator is degraded in performance as compared with the attenuator of the first embodiment shown in FIG. 2.

Figure 4:
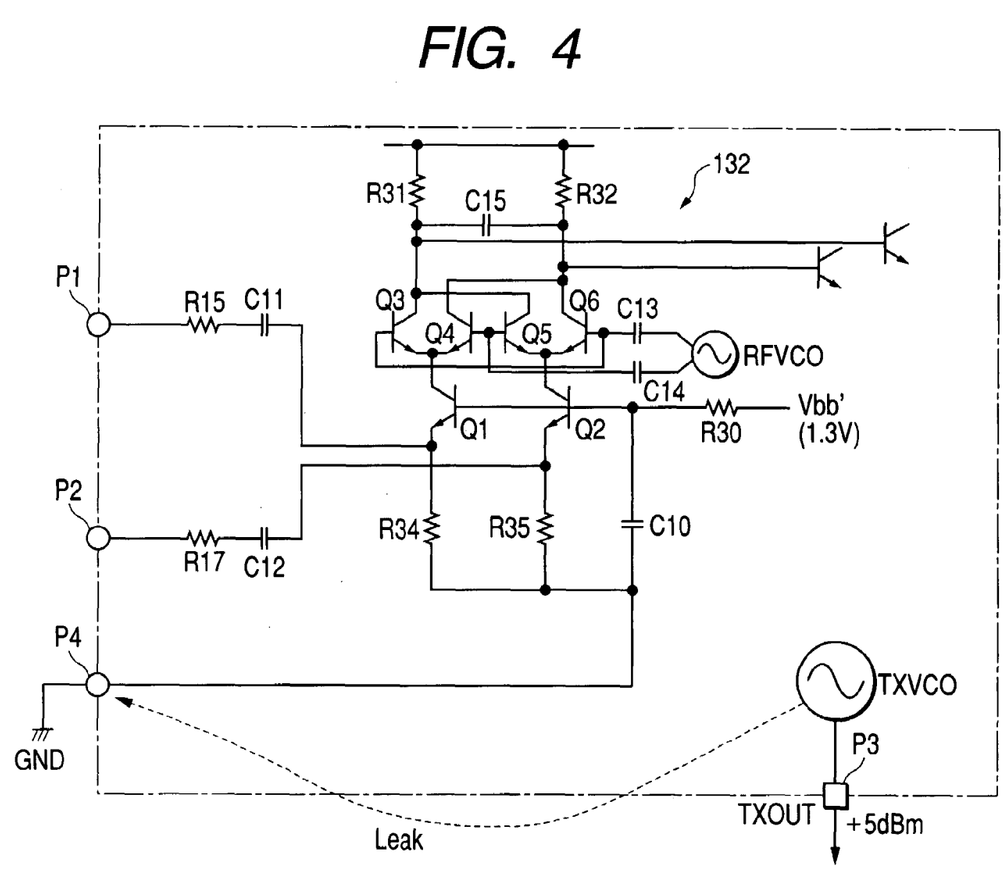
FIG. 4 is a circuit diagram showing a second embodiment illustrative of both an attenuator provided between a coupler for detecting an output level of a power amplifier and a down-converting mixer and the down-converting mixer.

Meanwhile, each of the attenuator of the first embodiment shown in FIG. 2 and the modification of FIG. 3 has been explained under the condition that the ground potential inside the chip is sufficiently stable. In an actual device, however, a ground potential GND is often supplied from an external terminal (pin P4) through a bonding wire or a wiring lying inside a chip in a manner similar to the input pins P1 and P2 as shown in FIG. 4. In such a case, there is a fear that noise jumped from an output pin P3 of the TxVCO to the ground pin P4 will be round intruded into an input terminal of a mixer 132 to thereby deteriorate a CMRR (inphase component removal ratio).

FIG. 4 shows an attenuator and a mixer according to a second embodiment, which enables prevention of deterioration of CMRR due to round intrusion of noise jumped into the ground pin P4. The second embodiment is principally different from the first embodiment shown in FIG. 2 in that (1) R15 through R18 are provided on the chip as the resistors constituting the π-type attenuator in the first embodiment shown in FIG. 2, whereas in the second embodiment shown in FIG. 4, only resistors R15 and R17 like, for example, 646Ω are used as the resistors formed on the chip and the resistors R16 and R18 connected to the ground point are omitted, (2) differential input transistors Q1 and Q2 of the mixer 132 are used as a common-base type with an emitter as the input in place of the common-emitter type with the base as the input, and a bias voltage Vbb' like, for example, 1.3V is applied to the bases via a resistor R30, and (3) a capacitive element C10 is provided between the bases of the transistors Q1 and Q2 and the ground point. External resistors are configured so as to well attenuate a signal detected by the corresponding coupler 220 by −26 dBm and send the signal to the input pin P1 in a manner similar to the first embodiment shown in FIG. 2.

Although the circuit shown in FIG. 2 includes the noise round intruded into the transistors Q1 and Q2 from the ground line through the resistors R16 and R18 constituting the attenuator, the second embodiment does not include the noise. The noise jumped into the ground pin P4 from the output pin P3 of the TxVCO is transferred to the respective bases of the transistors Q1 and Q2 via the capacitive element C10 and transferred to the respective emitters of the transistors Q1 and Q2 from the ground potential of the mixer 132 via resistors R34 and R35. Therefore, the base-to-emitter voltages of the transistors Q1 and Q2 have no gain with respect to the noise carried through the ground line. As a result, the circuit shown in FIG. 4 becomes satisfactory in CMRR as compared with the circuit shown in FIG. 2.

Figure 5:
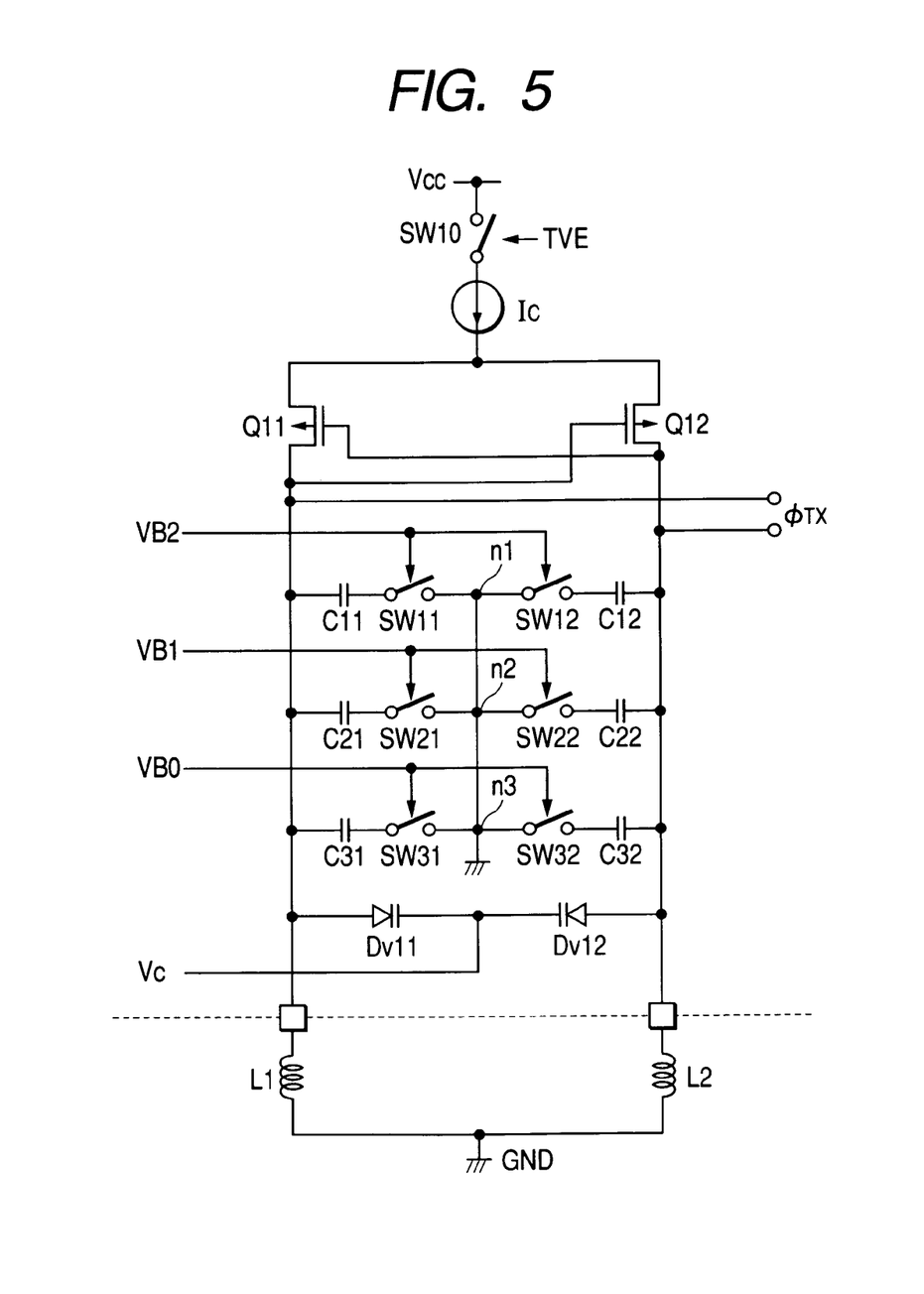
FIG. 5 is a circuit diagram illustrating one example of a transmitting oscillator employed in the embodiment of the present invention.

FIG. 5 shows an LC resonant oscillator used as one embodiment of a transmitting oscillator TxVCO. As shown in FIG. 5, the oscillator according to the present embodiment comprises a pair of P channel MOS transistors Q11 and Q12 of which the sources are connected in common and the gates and drains are cross-connected, a constant current source Ic connected between the common sources of the transistors Q11 and Q12 and a power supply voltage terminal Vcc, a switch SW10 provided in series with the constant current source Ic, inductors (coils) L1 and L2 respectively connected between the drains of the transistors Q11 and Q12 and a ground point GND, a first series circuit including a capacitor C11, switches SW11 and SW12 and a capacitor C12 connected in series between drain terminals of the transistors Q11 and Q12, a second series circuit parallel-connected to the first series circuit and including a capacitor C21, switches SW21 and SW22 and a capacitor C22, a third series circuit parallel-connected to the first series circuit and including a capacitor C31, switches SW31 and SW32 and a capacitor C32, and varactor diodes Dv11 and Dv12 used as variable capacitive elements series-connected between the drain terminals of the transistors Q11 and Q12. The varactor diodes Dv11 and Dv12 can be configured of P channel MOS transistors. The transistors Q11 and Q12 may be bipolar transistors.

The switches SW11 through SW32 are respectively on/off-controlled by band select signals VB2 through VB0 supplied from the control circuit 180 shown in FIG. 1. Thus, the oscillation frequency of the TxVCO is changed stepwise. On the other hand, a control voltage Vc supplied from the loop filter LPF1 is applied to one terminals of the varactor diodes Dv11 and Dv12 to thereby control the frequency continuously.

Described specifically, when the number of ones respectively brought to an on state, of the switches SW11 through SW32 increases, the value of each capacitor connected between the drain terminals of the transistors Q11 and Q12 becomes large so that the oscillation frequency becomes low. On the other hand, when the number of ones respectively brought to an on state, of the switches SW11 through SW32 decreases, the oscillation frequency becomes high. These switches SW11 through SW32 are selectively turned on according to whether the transmission mode is GSM, DCS or PCS.

The switch SW10 provided in series with the constant current source Ic is a start-up switch. When the switch SW10 is turned on, the oscillator starts its oscillating operation, whereas when the switch SW10 is turned off, the oscillator stops oscillating. The constant current source Ic may be directly on/off-controlled as an alternative to the provision of the switch SW10. The switch SW10 is controlled by a switching signal TVE outputted from the control circuit 180.

In the high-frequency IC 100 employed in the embodiment of FIG. 1, on-chip elements are used as inductors that constitute the high-frequency oscillator RFVCO and the intermediate frequency oscillator IFVCO each comprising the LC resonant oscillator. On the other hand, as to the transmitting oscillator TxVCO, external elements are used as the inductors L1 and L2 of a GSM TxVCO, and the inductors L1 and L2 of a DCS/PCS TxVCO are built in an IC. This is because the use of the on-chip inductors in the GSM TxVCO encounters difficulties in obtaining sufficient Q (quality factor).

While the invention made above by the present inventors has been described specifically based on the illustrative embodiments, the present invention is not limited to the embodiments. It is needless to say that various changes can be made thereto within the scope not departing from the gist thereof. Although the embodiment has explained, for example, the case in which the external terminals are used as the inductors L1 and L2 of the GSM TxVCO, there is no need to use the external elements if inductors each having a desired characteristic can be obtained by on-chip elements. Although the signals of the input pins P1 and P2 are respectively inputted to the emitters of the differential input transistors Q1 and Q2 via the resistors R15 and R17 and capacitors C11 and C12 in the second embodiment of FIG. 4, the signals of the input pins P1 and P2 may be inputted to the transistors Q1 and Q2 respectively.

Although the embodiment has explained the case in which the present invention is applied to the polar loop type wireless communication system having a phase control loop and an amplitude control loop, the present invention can be widely applied to a high-frequency IC wherein an essential part of a transmitting oscillator is formed on a chip, an oscillation signal is outputted from an external terminal of the high-frequency IC and a detected signal outputted from a power amplifier is fed back to the high-frequency IC, and a wireless communication system using the same.

Although a description has been made above of the case in which the present invention is applied to the triple band type system configured so as to enable the communications that comply with the three systems of the GSM system, DCS1800 system and PCS1900 system, the present invention can be applied to a dualband type system configured so as to enable communications that comply with any one of the GSM system, DCS system and PCS system or any two of them, a quadband type system, and a high-frequency IC used in it.

Advantageous effects obtained by typical ones of the inventions disclosed in the present application will be described in brief as follows:

According to the present invention, a wireless communication system having two feedback control loops of a phase control loop and an amplitude control loop is capable of reducing the number of parts constituting the system, and enhancing packaging density to thereby bring it into less size and lower the cost thereof.

Further, a wireless communication system having a feedback control loop for controlling output power of a power amplifier is capable of preventing degradation of the accuracy of control on the output power of the power amplifier due to noise jumped from an output pin of a transmitting oscillator to an input pin for a detected signal of an output level of the power amplifier where the transmitting oscillator is built in a communication semiconductor integrated circuit device like a high-frequency IC constituting the system.

What is claimed is:

1. A communication semiconductor integrated circuit device, comprising:
    a transmitting oscillator including at least constituent elements excluding inductance elements, which are formed over a semiconductor chip;
    a first external terminal which is coupled to the transmitting oscillator for outputting a signal generated by the transmitting oscillator therethrough;
    a phase detection circuit which compares a phase of a reference signal and a phase of a feedback signal, and which is coupled to the transmitting oscillator for controlling the transmitting oscillator in accordance with the phase difference;
    a second external terminal which receives a signal supplied from outside that is related to an output of the transmitting oscillator; and
    a signal combinational circuit which is coupled to the second external terminal and which combines the signal inputted through the second external terminal and a signal having a predetermined frequency,
    wherein the signal combinational circuit comprises:
    a differential circuit including a pair of differential input terminals, and
    attenuation means that attenuates the signal input to the second external terminal,
    wherein the attenuated signal is provided between one differential input terminal of the signal combinational circuit and the second external terminal, and the other differential input terminal of the signal combinational circuit is connected to a third external terminal via elements identical to elements that constitute the attenuation means, and
    wherein the signal combinational circuit is coupled to the phase detection circuit for providing the feedback signal.

2. A communication semiconductor integrated circuit device according to claim 1, wherein the third external terminal is a terminal to which a significant signal is input from outside and set so as not to output a significant signal from inside.

3. A communication semiconductor integrated circuit device according to claim 1, further comprising:
    an amplitude detection circuit which compares the amplitude of the feedback signal and the amplitude of the reference signal and generates a signal corresponding to a difference in amplitude between the feedback and reference signals, and a fourth external terminal which outputs a voltage corresponding to the signal output from the amplitude detection circuit.

4. A communication semiconductor integrated circuit device according to claim 1, wherein the signal combinational circuit comprises:
    a Gilbert cell comprising bipolar transistors, the signal input to the second external terminal is input to an emitter terminal of one of lower differential input transistors of the Gilbert cell, and the third external terminal is connected to an emitter terminal of the other of the lower differential input transistors of the Gilbert cell via the elements identical to the elements constituting the attenuation means.

5. A communication semiconductor integrated circuit device according to claim 1, wherein the signal combinational circuit is a mixer which generates a signal of a frequency equivalent to a difference between the frequency of the signal input to the second external terminal and the frequency of the signal having the predetermined frequency.

6. A communication semiconductor integrated circuit device according to claim 1, further comprising:
    an oscillator which generates the signal having the predetermined frequency; and
    a second mixer which combines the signal generated by the oscillator and the signal generated by the transmitting oscillator and generates a signal having a frequency component equivalent to a difference in frequency between the signal generated by the oscillator and the signal generated by the transmitting oscillator, wherein the output signal of the second mixer is supplied to the phase detection circuit.

7. A communication semiconductor integrated circuit device according to claim 6, further comprising:

switching means which selects and supplies any of the output signal of the second mixer and the feedback signal to the phase detection circuit.

8. A wireless communication system, comprising:

a communication semiconductor integrated circuit device, said communication semiconductor integrated circuit device including:

a transmitting oscillator including at least constituent elements excluding inductance elements, which are formed over a semiconductor chip, a first external terminal which is coupled to the transmitting oscillator for outputting a signal generated by the transmitting oscillator therethrough, a phase detection circuit which compares a phase of a reference signal and a phase of a feedback signal, and which is coupled to the transmitting oscillator for controlling the transmitting oscillator in accordance with the phase difference, a second external terminal which receives a signal supplied from outside that is related to an output of the transmitting oscillator, a signal combinational circuit which is coupled to the second external terminal and which combines the signal input through the second external terminal and a signal having a predetermined frequency, an amplitude detection circuit which compares amplitude between the signal combined by the signal combinational circuit and the reference signal and feedback signal and detects the difference in amplitude, voltage generating means which generates a voltage corresponding to the detected amplitude difference, and a third external terminal which outputs the voltage generated by the voltage generating means;

a power amplifier which amplifies the signal output through the first external terminal with gain corresponding to the voltage output through the third external terminal and outputs an amplified signal;

output detecting means which detects the output of the power amplifier; and attenuation means which attenuates the signal detected by the output detecting means and provide the attenuated signal to the second external terminal, wherein the attenuation means sets the amount of attenuation of the detected signal in such a manner that when the power amplifier is operating at the minimum output level, the level of the detected signal input to the second external terminal becomes greater than the level of noise jumped from the first external terminal to the second external terminal.

9. A wireless communication system according to claim 8, wherein the signal combinational circuit comprises:

a differential circuit including a pair of differential input terminals, attenuation means that attenuates the signal input to the second external terminal, wherein the attenuated signal is provided between one differential input terminal of the signal combinational circuit and the second external terminal, and the other differential input terminal of the signal combinational circuit is connected to a fourth external terminal via elements identical to elements that constitute the attenuation means, and wherein a resistive element is provided between the fourth external terminal and an external constant voltage terminal of the communication semiconductor integrated circuit device.

10. A wireless communication system according to claim 8, further comprising:

a baseband circuit which generates and outputs an In-phase and Quadrature (I/Q) signal corresponding to transmit data, wherein the communication semiconductor integrated circuit device includes a modulator which performs quadrature modulation in accordance with the I/Q signal supplied from the baseband circuit, and supplies the signal modulated by the modulator to the phase detection circuit and the amplitude detection circuit as the reference signal.

11. A communication semiconductor integrated circuit device, comprising:

a transmitting oscillator including at least constituent elements excluding inductance elements, which are formed over a semiconductor chip;

a first external terminal which is coupled to the transmitting oscillator for outputting a signal generated by the transmitting oscillator therethrough;

a phase detection circuit which compares a phase of a reference signal and a phase of a feedback signal, and which is coupled to the transmitting oscillator for controlling the transmitting oscillator in accordance with the phase difference;

a second external terminal which receives a signal supplied from outside that is related to an output of the transmitting oscillator; and a signal combinational circuit which is coupled to the second external terminal and which combines the signal input through the second external terminal and a signal having a predetermined frequency, wherein the signal combinational circuit includes:

a differential circuit including a pair of differential input terminals, first attenuation means provided between one differential input terminal of the signal combinational circuit and the second external terminal, and second attenuation means is provided between the other differential input terminal of the signal combinational circuit and a third external terminal supplied with a predetermined potential.

* * * * *